United States Patent [19]
Graves

[11] 3,939,341
[45] Feb. 17, 1976

[54] PHASE-LOCKED OPTICAL HOMODYNE RECEIVER

[75] Inventor: Ross E. Graves, Pacific Palisades, Calif.

[73] Assignee: Hughes Aircraft Company, Culver City, Calif.

[22] Filed: Apr. 2, 1975

[21] Appl. No.: 564,579

[52] U.S. Cl. .............. 250/199; 325/329; 325/330; 325/421; 325/444; 329/50; 329/144; 331/23
[51] Int. Cl.².... H03D 1/24; H04B 1/30; H04B 9/00
[58] Field of Search ........... 250/199; 325/329, 330, 325/346, 349, 420, 421, 442, 444; 329/50, 144, 153, 154, 178, DIG. 1; 331/23

[56] References Cited
UNITED STATES PATENTS

| | | | |
|---|---|---|---|
| 3,083,299 | 3/1963 | Cruse | 250/203 |
| 3,147,441 | 9/1964 | Adler | 325/485 |
| 3,258,597 | 6/1966 | Forrester | 250/199 |
| 3,328,583 | 6/1967 | Davison | 250/199 |
| 3,329,900 | 7/1967 | Graves | 325/346 |
| 3,519,740 | 7/1970 | Glassman | 178/7.3 |
| 3,571,597 | 3/1971 | Wood et al. | 250/199 |
| 3,573,463 | 4/1971 | Goodwin et al. | 250/199 |

*Primary Examiner*—Robert L. Griffin
*Assistant Examiner*—Marc E. Bookbinder
*Attorney, Agent, or Firm*—W. H. MacAllister, Jr.; D. O. Dennison

[57] ABSTRACT

An improved homodyne receiver for use in wideband optical communications systems is disclosed. The invention provides phase-locked homodyne reception of non-suppressed carrier or suppressed carrier input signals. Novel means are provided in the receiver for generating an error signal to provide phase-locked operation in the presence of noise and frequency excursions of the received signal.

11 Claims, 2 Drawing Figures

PHASE-LOCKED OPTICAL HOMODYNE RECEIVER

FIELD OF THE INVENTION

This invention relates to wideband communication receivers and more specifically to homodyne receivers operable at wavelengths in the "optical" region.

DESCRIPTION OF THE PRIOR ART

In the past decode and one-half, many types of communications systems have been suggested which use the coherent output of laser oscillators as the information carrier. Beginning with the first of such systems which merely used amplitude or loss modulation of a laser beam and simple quantum detection techniques, such systems have evolved with improvements being made to the modulators, detectors, and directing optics of the laser beams. The vast spectrum made available by laser communications is, of course, well known. At the optical wavelengths of lasers, which includes not only the visible region but the infrared region as well, the generation of extremely narrow beams is highly conservative of the transmitted energy and at the same time provides a great deal of spatial security against undesired reception.

While the potential of wideband laser communication appeared virtually limitless, the availability of components necessary to realize such systems was limited. Over the intervening years, a great number of laser communication systems have been proposed, constructed, and operated. Because of the many advantages enjoyed by lasers utilizing carbon dioxide as the active laser medium, they have been the focus of much recent attention. The improvements which have made such communications systems possible have included the development of highly reliable $CO_2$ lasers, the development of wideband optical modulators, the development of efficient wideband detectors, and the development of suitable optical components and subsystems.

Borrowing heavily from the radio frequency art, the receivers which have been proposed for use with such $CO_2$ laser communications systems have generally operated on the so-called heterodyne principle in which the incoming optical signal is mixed with the coherent output of a local oscillator to produce a difference or intermediate frequency generally at RF. This RF intermediate frequency is then processed using relatively straightforward RF techniques.

While the advantages of receivers operating on the homodyne principle have been recognized at optical wavelengths for some time, a practical implementation of such a receiving system has not been available. The advantages of optical homodyne receivers include a theoretical three decibel improvement in noise performance over the heterodyne method. In contrast to the heterodyne receiver, the homodyne receiver also makes fuller, and therefore more efficient, use of the bandwidth of the optical detector. That is, for a given detector bandwidth, the homodyne receiver can accept modulation frequencies on the order of three or four times higher than those which the heterodyne receiver can accept. And, since the optical detector bandwidth is an important technical system constraint, homodyne detection offers a significant advantage in system performance over heterodyne detection.

It is, therefore, a general object of the present invention to provide a homodyne receiver operable at optical wavelengths.

It is another object of the present invention to provide an optical homodyne receiver capable of being phase-locked to the received signal over a wide range of carrier frequencies.

By way of review, homodyne detection represents a somewhat degenerate case of heterodyne detection in which the local oscillator of the receiver is at the same frequency as the received signal carrier. In other words, the homodyne receiver is much like a heterodyne receiver having an intermediate frequency (IF) of zero Hertz. Also, in the context of the present invention, the phase of the incoming carrier and the phase of the local oscillator must be substantially in phase or antiphase at the optical detector. Precise phase alignment on the order of a few degrees, of course, requires a phase-tracking loop in the optical receiver. Furthermore, this phase-tracking loop must have a substantial bandwidth in order to maintain lock on received signals which quite often are characterized by undesirable frequency excursions.

Communication between moving vehicles or between a fixed station and a moving vehicle, for example, requires a wide range tracking loop for Doppler shift compensation. In addition, noise in the form of unwanted excursions of the frequency of the received signal or the receiver local oscillator itself requires a tracking loop with wideband response characteristics.

It is, therefore, another object of the present invention to provide a phase-locked optical homodyne receiver having the capability to track a wide range of incoming carrier frequencies.

As mentioned, proper operation of a homodyne receiver as contemplated herein requires that the local oscillator signal be precisely at the frequency of the received signal carrier and either in phase of 180° out of phase with it. The primary reason that optical homodyne receivers have not been employed in the past centers on the fact that no suitable means has been available for generating an error signal which can be used to provide this phase locking. More fundamentally, this difficulty is rooted in the fact that while the output of an optical homodyne detector contains a DC term proportional to the cosine of the phase difference between the carrier and the local oscillator, this phase error signal cannot be distinguished from the other DC components of the detector output. In addition, the phase error signal is immersed in other low frequency noise components such as those generated by the so-called "local oscillator-cross-local oscillator" products, amplifier noise, and "1/f" noise and is therefore unsuitable for precise phase tracking.

It is therefore another object of the present invention to provide an optical homodyne receiver having novel means for generating and detecting phase error in a phase-locked loop.

SUMMARY OF THE INVENTION

In keeping with the principles of the present invention, the technique for generating the phase error signal consists of "marking" the received optical input signal with an identifying modulation before it is combined with the local oscillator signal prior to the input of the optical detector. The phase error signal is thereafter recovered from the optical detector output at this locally-generated modulation frequency.

In a first embodiment, the received optical input signal is phase modulated by an electro-optic modulator driven by means of a relatively low frequency modulation oscillator. The phase modulated input signal is then added optically to the local oscillator signal and the combined signals coupled to the input of an optical detector. The detected video output is amplified in a video amplifier which suppresses the DC and low-frequency components while amplifying the information and error signal components. A portion of the output from the video amplifier is coupled through a bandpass filter tuned to the frequency of the modulation oscillator. The error signal component and a portion of the output of the modulation oscillator are then compared in a phase detector, used as a synchronous AM detector, which provides the signal which controls the frequency and phase of the laser local oscillator.

In a second embodiment of the invention suitable for use with suppressed carrier optical input signals, the marking is accomplished by means of a phase modulator inserted in the signal path as before. The error signal component is therefore superimposed upon the envelope of the modulated portion of the received signal. An envelope detector is utilized at the output of the video amplifier following the optical detector in order to recover the amplitude modulated error signal component. The amplitude modulated error signal component and a portion of the output of the modulation oscillator are again compared to furnish the control signal for the tunable laser local oscillator.

BRIEF DESCRIPTION OF THE DRAWINGS

In order that the invention may be clearly understood and readily carried into effect, it will now be described with reference by way of example to the accompanying drawings wherein like reference numerals correspond to like structural elements and in which.

DESCRIPTION OF THE PREFERRED EMBODIMENTS

Figure 1:
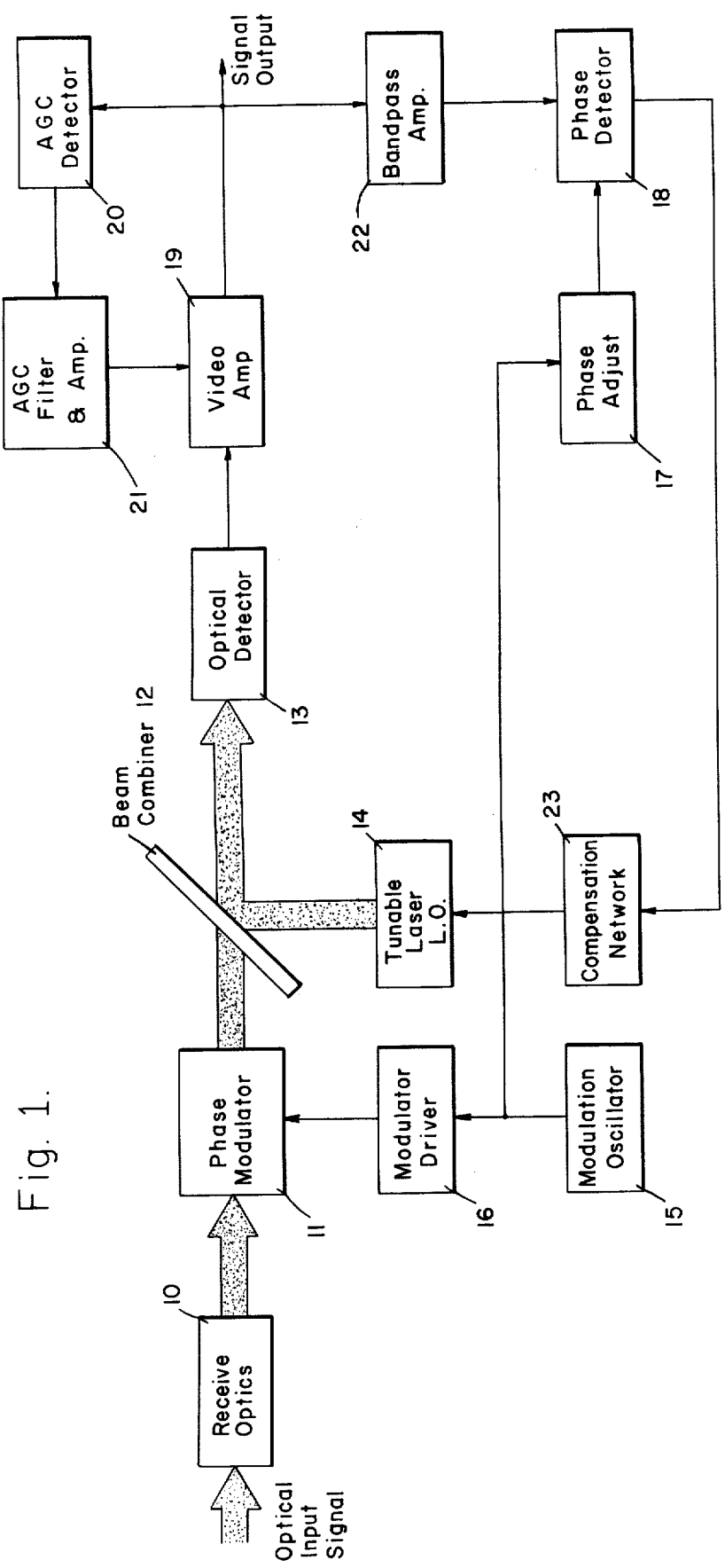
FIG. 1 is a block diagram of a first embodiment of the present invention.

Referring more specifically to the drawings, there is shown in FIG. 1 a block diagram of a first preferred embodiment of the present invention. An input signal at optical wavelengths, which is meant to include the infrared region of the spectrum, is applied to the receive optics 10. The receive optics typically includes telescope or other beam collimating means and, where appropriate, electromechanical scanning and/or beam directing means for acquiring and tracking the incoming signals.

In modern laser communications systems the received signal consists of an optical carrier modulated by information-bearing modulation components extending over many tens or hundreds of megahertz. A preferred modulation format for which the present embodiment is well adapted is wideband amplitude modulation and more specifically biphase modulation with a residual carrier. The suppressed carrier format will be mentioned in connection with the embodiment of FIG. 2. As mentioned hereinabove, it may also be assumed in connection with the present embodiment that the optical wavelength of the incoming carrier is in the region of 10.6 microns. This corresponds, of course, to a preferred transition of the $CO_2$ laser which, as noted above, is commonly employed in such communications systems. It is to be understood, however, that the choice of such an operating wavelength is merely exemplary and that other lasers operating on other wavelengths can be used with suitable modifications to the components of the embodiments to be described.

Returning to the description of the embodiment of FIG. 1, the optical input signal is transmitted through a phase modulator 11 and a beam combiner 12 to the input of an optical detector 13. A tunable laser local oscillator 14 also of the $CO_2$ type operating on the same transition and at a nominal wavelength corresponding to that of the carrier of the input signal is provided. The output of the tunable laser local oscillator 14 is combined with the phase modulated input signal by means of a beam combiner 12. Beam combiner 12, which can comprise a beam-splitting mirror or other suitable device, spatially combines the phase modulated input signal with the local oscillator beam. If the two beams are spatially well aligned, optical interference will take place on the photodetector surface of optical detector 13.

Phase modulator 11, which can conveniently comprise an electro-optic modulator of conventional design and suitable for the frequencies of interest, is driven by means of a modulation oscillator 15 coupled through a modulator driver 16. In a practical embodiment, the modulation oscillator 15 comprises a 12.5 megahertz crystal oscillator and modulator driver 16 comprises a narrow band tuned transistor amplifier. A portion of the output of modulation oscillator 15 is also coupled to a phase adjustment circuit 17 to one input of a phase detector 18.

The output of optical detector 13 is coupled to a wideband video amplifier 19 having a response characteristic which matches the bandwidth of the baseband information containing components of the input signal. Typically, the response of the video amplifier 19 does not include the DC and low-frequency components discussed above but does extend to an upper cutoff frequency of several hundred megahertz.

The output of video amplifier 19 comprises the signal or video output of the homodyne receiver of FIG. 1. This output signal is supplied to appropriate utilization devices not shown for demultiplexing, demodulating, and decoding the modulation components of the received signals, as required. A portion of the video output from video amplifier 19 is coupled to an AGC detector 20 and through an AGC filter and amplifier 21 to the AGC input of video amplifier 19.

Another portion of the output from video amplifier 19 is coupled through a bandpass amplifier 22 which is tuned to the frequency of modulation oscillator 15. The output of bandpass amplifier 22 is, in turn, coupled to the second input of phase detector 18. The output of phase detector 18 is coupled to a compensation network 23 to the control input of the tunable laser local oscillator 14.

In operation, the incoming optical signal is applied to receive optics 10 and directed through phase modulator 11 and beam combiner 12. The beam from tunable laser local oscillator 14 is also applied to beam combiner 12 and the superimposed signal and local oscillator beams in turn coupled to optical detector 13. In an experimental embodiment, phase modulator 11 was adjusted to provide a phase deviation of on the order of 10 milliradians at a frequency of 12.5 megahertz. In a practical embodiment, however, a phase deviation of one hundred or more milliradians is desirable for optimum signal-to-noise ratio for phase tracking.

The output of optical detector 13 is amplified by the AC-coupled wideband video amplifier 19. As mentioned hereinabove, a low-frequency cutoff is provided for this amplifier to suppress the DC and low-frequency components. The video baseband signal is then coupled out of the video amplifier 19 to the radio frequency utilization circuitry not shown. A portion of the output signal is also taken from video amplifier 19 and detected and filtered to provide the AGC bias for the video amplifier.

The low frequency cutoff of video amplifier 19 should be chosen high enough to suppress the so-called "1/f noise" and the local oscillator-cross-local oscillator products, so that the receiver noise performance is largely determined by the local oscillator shot noise. At the same time the low-frequency cutoff should be sufficiently low to pass the significant frequency components of the signal modulation and also to pass the frequency of the modulation oscillator. The precise choice of this cutoff frequency depends upon the details of the particular signal modulation received and upon the frequency of the phase modulation superimposed on the laser local oscillator. In a 300 megabit per second biphase-modulated system, for example, a lower cutoff frequency of 1 megahertz and an upper cutoff frequency on the order of 200 megahertz or more should prove satisfactory.

Returning now to the operation of the homodyne receiver of FIG. 1, the portion of the output of video amplifier 19 coupled through bandpass amplifier 20 is synchronously detected with respect to a suitably phase shifted portion of the output from modulation oscillator 15. The output of phase detector 18 is filtered and amplified as necessary in compensation network 23 and applied to the tuning element of laser local oscillator 14 to control its frequency and phase. The phase adjustment circuit 17 serves to compensate for fixed phase shifts in bandpass amplifier 22 and the other circuitry so that the inputs to the phase detector will have the desired nominal phase relation for the type phase detector utilized.

A tunable laser local oscillator suitable for use in the present invention is disclosed in my copending application entitled "Tunable Laser Oscillator," Ser. No. 564,569, filed Apr. 2, 1975, and assigned to the present assignee. That application describes the manner in which wide range, wideband tuning can be achieved.

The bandwidth of bandpass amplifier 22 should be large relative to the bandwidth of the phase control loop so that amplifier 22 is able to pass the frequencies required to obtain the desired loop dynamic response. In general, it is also advantageous to provide sufficient gain in amplifier 22 to minimize the effects of phase detector offset and the DC gain needed in the compensation network 23. In practice, a reasonable bandwidth for the phase control loop is on the order of 100 kilohertz. Such a control loop bandwidth is expected to be sufficient to "wipe off" the phase noise in the received signal and in the receiver local oscillator signal. With this loop bandwidth the corresponding bandwidth of bandpass amplifier 22 would be at least several hundred kilohertz. As mentioned hereinabove, the frequency of modulation oscillator 15 in an experimental embodiment was selected as 12.5 megahertz. Lower or higher phase modulator frequencies can be employed with corresponding modifications to the other circuit components.

One limitation of the phase-locked optical homodyne receiver of FIG. 1 is that a residual carrier must be provided at the optical transmitter in order to provide the proper generation of the phase error signal in the manner described. If, as is generally the case, the peak deviation of the phase modulator is to be kept as small as possible, a significant amount of the total transmitted power must be kept in the carrier with a consequent reduction in the amount of power available for the modulation components. For these reasons, a receiver design which would provide a suitable phase error signal from a suppressed-carrier optical signal is desirable. Such a homodyne receiver is shown in the block diagram of FIG. 2.

Figure 2:
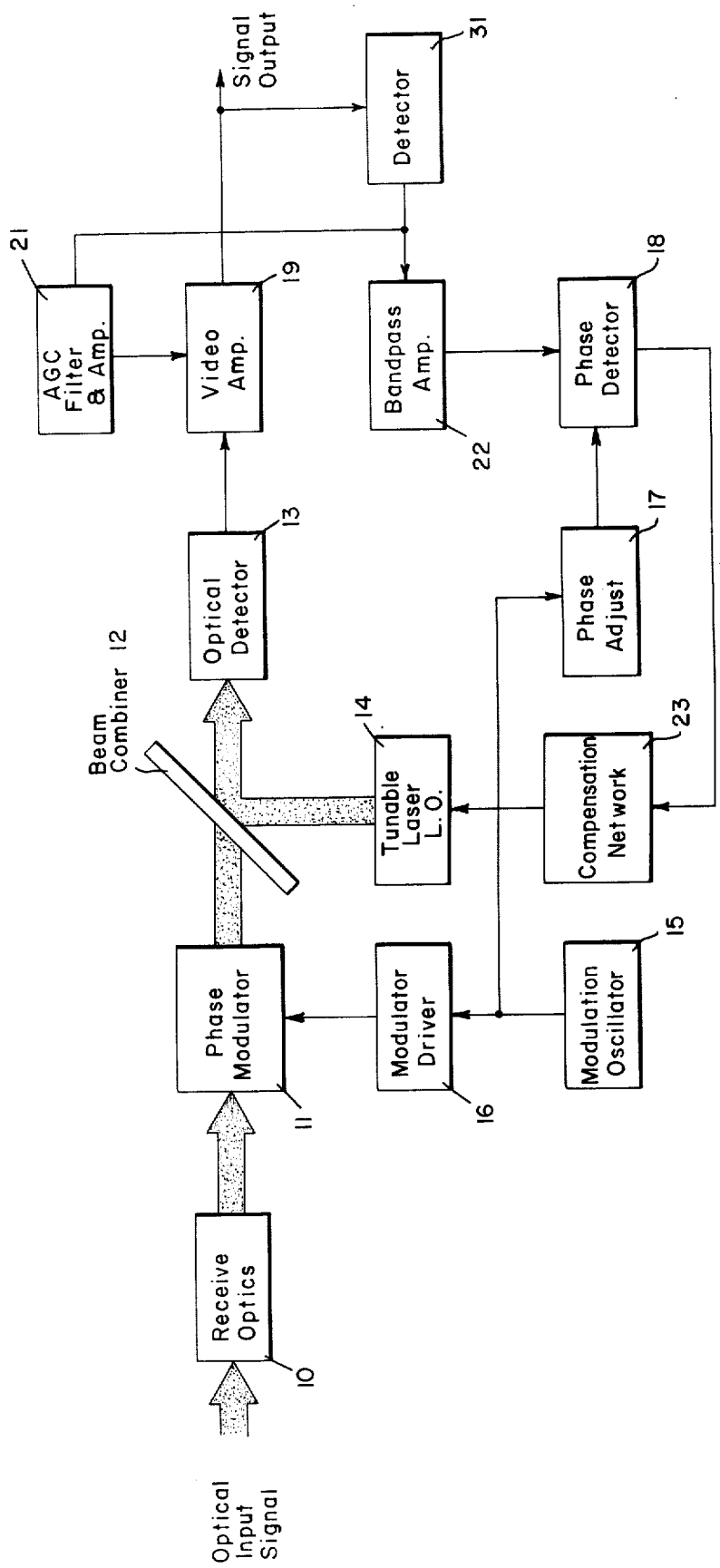
FIG. 2 is a block diagram of a second embodiment of the present invention suitable for the reception of suppressed carrier signals.

The embodiment of FIG. 2 is similar to that of FIG. 1 with the exception that a wideband detector 31 is employed at the output of video amplifier 19. This detector is placed between the wideband video amplifier output and the input to bandpass amplifier 22 in the phase control loop. In practice, detector 31 can be either half-wave or full-wave. A full-wave linear envelope detector, however, is preferred since its use results in a reduction in the "modulation noise" from the modulation components of the signal which may incidentally be coupled into the phase control loop. Detector 31 may also be utilized as the AGC detector thereby assuring that the receiver gain will be maintained so as to provide the proper signal level at the signal output port and that the phase control loop gain will be maintained at or very near to its design value. As an alternative, a separate AGC detector can be used as shown in the embodiment of FIG. 1.

It is seen that the essence of the embodiment of FIG. 2 is the addition of wideband detector 31 to extract the error signal carrier from the modulation superimposed on the envelope of the output signal from video amplifier 19. This envelope detection is the means by which the desired AM is recovered from the portion of the received signal which is passed by video amplifier 19. Thus, all of the signal modulation plays a role in generation of the error signal carrier. It follows, therefore, that the error signal carrier can be recovered without requiring that an excessive portion of the transmitted signal be present as signal carrier. In fact, suppressed carrier operation is preferable as it makes full use of the transmitted power for the information sidebands and provides the largest possible error signal carrier for a given peak phase deviation in phase modulator 11.

Another significant advantage of recovering the error signal carrier from the envelope of the modulated signal is that when digital data are transmitted in a biphase modulation format, the resulting fluctuations in the envelope of the signal at the output of detector 31 are much smaller than the fluctuations in the signal at the output of the video amplifier. It follows from this fact that the modulation noise at the output of detector 31 is greatly reduced relative to that at its input, thereby reducing any modulation noise which is incidentally coupled into the phase-control loop.

In the embodiments of FIGS. 1 and 2 the phase modulator 11 is shown in the optical input signal path. It should be noted that it is also possible to place the phase modulator in the path between the output of tunable laser local oscillator 14 and beam combiner 12. As a matter of practice, however, the phase modulator may give rise to incidental amplitude modulation accompanying the desired phase modulation. If the phase modulator is disposed in the local oscillator path, this incidental amplitude modulation may result in undesirable spurious modulation products in the phase control loop error signal.

In all cases, however, it is understood that the above-described embodiments are merely illustrative of but two of the many possible specific embodiments which can represent applications of the principles of the present invention. Numerous and varied other arrangements can be readily devised in accordance with these principles by those skilled in the art without departing from the spirit and scope of the invention.

What is claimed is:

1. A phase-locked optical homodyne receiver comprising, in combination:
   means for receiving an optical input signal, said input signal being characterized by a carrier frequency and information-containing modulation components;
   controllable means for generating an optical local oscillator signal having substantially the same frequency as said carrier frequency;
   modulating means for phase modulating one of said signals with a reference modulation signal having a frequency which is substantially low compared to said carrier frequency;
   means for combining said phase-modulated signal with the other of said signals;
   means for optically detecting said combined signals;
   means for deriving an output signal from said optically detected signals; and
   means for synchronously detecting said output signal by providing an error signal responsive to said reference modulation signal at said reference frequency and a portion of said output signal, said error signal coupled to said local oscillator signal generating means to maintain said local oscillator signal and said carrier in phase synchronism.

2. A phase-locked optical homodyne receiver comprising, in combination:
   means for receiving an optical input signal, said signal being characterized by a carrier and at least one sideband;
   controllable means for generating an optical local oscillator signal having substantially the same frequency as said carrier;
   modulating means for phase modulating said input signal with a reference modulation signal having a frequency which is substantially low compared to said carrier frequency;
   means for combining the phase modulated input signal and said local oscillator signal;
   means for optically detecting said combined signals;
   means for deriving an output signal from said optically detected signals; and
   means for synchronously detecting said output signal by providing an error signal responsive to said reference modulation signal at said reference frequency and a portion of said output signal, said error signal coupled to said local oscillator signal generating means to maintain said local oscillator signal and said carrier in phase synchronism.

3. The receiver according to claim 2 wherein said local oscillator signal generating means comprises a tunable laser oscillator.

4. The receiver according to claim 2 wherein said modulating means includes a modulation oscillator and an electro-optic phase modulator.

5. The receiver according to claim 2 wherein said combining means comprises a beam-spltting mirror.

6. The receiver according to claim 2 wherein said means for deriving an output signal comprises an amplifier.

7. A phase-locked optical homodyne receiver comprising, in combination:
   means for receiving an optical input signal, said signal characterized by a suppressed carrier of a given frequency and at least one sideband;
   means for phase modulating said input signal with a reference modulation signal having a frequency which is substantially low with respect to said given frequency;
   controllable means for generating an optical local oscillator signal having substantially the same frequency as said given frequency;
   means for combining said phase-modulated input signal with said local oscillator signal;
   means for optically detecting said combined signals;
   means for deriving an output signal from said optically detected signals;
   means for envelope detecting a portion of said video output signal; and
   means for synchronously detecting said output signal by providing an error signal responsive to said reference modulation signal at said reference frequency and the output signal of said envelope detecting means, said error signal coupled to said local oscillator signal generating means to maintain said local oscillator signal and said suppressed carrier in phase synchronism.

8. The receiver according to claim 7 wherein said local oscillator signal generating means comprises a tunable laser oscillator.

9. The receiver according to claim 7 wherein said modulating means includes a modulation oscillator and an electro-optic phase modulator.

10. The receiver according to claim 7 wherein said combining means comprises a beam-splitting mirror.

11. The receiver according to claim 7 wherein said means for deriving a video output signal comprises an amplifier.

* * * * *